United States Patent [19]

Lysinger et al.

[11] Patent Number: 5,311,467
[45] Date of Patent: May 10, 1994

[54] SELECTIVE BULK WRITE OPERATION

[75] Inventors: Mark A. Lysinger, Carrollton; William C. Slemmer; James Brady, both of Dallas; David C. McClure, Carrollton, all of Tex.

[73] Assignee: SGS-Thomson Microelectronics, Inc., Carrollton, Tex.

[21] Appl. No.: 864,481

[22] Filed: Apr. 7, 1992

[51] Int. Cl.$^5$ .............................................. G11B 7/00
[52] U.S. Cl. ......................... 365/189.01; 365/230.03; 365/230.06
[58] Field of Search ............... 365/189.01, 189.11, 365/218, 230.03, 230.05, 230.06

[56] References Cited

U.S. PATENT DOCUMENTS

| | | | |
|---|---|---|---|
| 4,789,967 | 12/1988 | Liou et al. | 365/218 |
| 4,949,309 | 8/1990 | Rao | 365/218 |
| 5,034,926 | 7/1991 | Taura et al. | 365/218 |
| 5,065,364 | 11/1991 | Atwood et al. | 365/218 |
| 5,191,556 | 3/1993 | Radjy | 365/218 |

Primary Examiner—Eugene R. LaRoche
Assistant Examiner—Tan Nguyen
Attorney, Agent, or Firm—Kenneth C. Hill; Lisa K. Jorgenson; Richard K. Robinson

[57] ABSTRACT

A memory is disclosed having a plurality of memory cells in a memory array arranged in rows and columns, each of the memory cells capable of storing a logic state therein. Each pair of bit lines is associated with one of the columns. A column decoder selects a column in the array responsive to a column address. A plurality of word line drivers selects, in response to a row address, a row of memory cells for connection with their associated pair of bit lines. A plurality of row isolation circuits isolates and enables a selected group of memory cells of each row from the remainder of the row in response to a bulk write signal. Each row isolation circuit has a conduction path between its associated word line driver and the selected memory cells in the associated row. A bulk write signal is sent to each column containing the selected memory cells. A first logic state is then written into the selected memory cells in response to the bulk write signal.

15 Claims, 1 Drawing Sheet

SELECTIVE BULK WRITE OPERATION

1. FIELD OF THE INVENTION

The present invention relates generally to semiconductor integrated memory circuits and more particularly to a bulk write operation for selected memory cells within each row of cells.

2. BACKGROUND OF THE INVENTION

Computer systems utilize cache memories to enhance system performance. A data cache contains the cached data, and a cache tag memory contains a portion of the address field, usually the most significant bits, of the addresses of the data stored in the cache. A processor, when making a memory access, accesses the desired memory location through the cache. If the desired location is already in the cache, access is complete. If it is not, the memory location is fetched from main system memory and loaded into the cache.

Any device used in specialty designs such as cache memories must take special device functions into consideration. For example, cache memories must occasionally be cleared, or written to in a bulk write operation. Often times the cache tag memory contains a valid bit for each address location, which is cleared to invalidate each entry. One technique for clearing cache memories utilizes a bulk write operation, which clears the entire memory in the cache tag for all tag bits including the valid bits. This allows the entire memory to be reset in a single step.

Special functions such as bulk write operations must be properly handled by any device design. Designs which improve device speed often do so at the expense of being able to handle more complex functions. Devices which can perform more complex functions such as flash clear often must sacrifice speed in order to do so.

Conventional memory devices such as static random access memories (SRAMs) are generally arranged in rows and columns. In these memory devices, a row select line, generally decoded from a row address value, connects each of a number of memory cells associated with the row address value to a pair of associated bit lines; each pair of bit lines is associated with a column of memory cells.

In prior systems, to clear the memory, traditional methods would clear the entire memory upon power up of the system or invalidation upon switching between programs by storing a zero in all of the memory locations by various methods. One method requires sequentially addressing all of the memory locations and forcing a zero therein. Another method of clearing the entire memory requires selecting all word lines and then writing a selected logic state into all cells.

One disadvantage to forcing all memory cells to zero is that drivers must be present which can drive all of the memory locations to a "0" logic state. The drive requirements for switching capacitances of the word lines and bit lines, thus clearing all of the memory cells, results in relatively large drive transistors. The resulting peak current of these methods often exceeds acceptable limits. If the entire memory can be cleared, one section at a time, for example, the current transients can be minimized or staggered. This approach, however, requires additional time to clear the entire memory.

Another method for clearing memory cells requires unbalancing the memory cells by raising ground on one side of cross coupled inverters. This method has been typically used with full CMOS cells. A disadvantage of this type of selective clearing is that some type of interconnection is required for each of the memory cells which increases the amount of space occupied by the memory array. To clear the memory cells, each column of memory cells requires a separate run of conductive material to interface with each of the memory cells for the clear function.

It is not necessary, however, to clear the entire memory. Only valid bits in cache applications, for example, need to be cleared. With larger densities, it is desirable to confine clear, or bulk write, functions to only a portion of the memory to reduce transient current and time required to clear the memory. There, therefore, exists a need for a more versatile memory that allows clearing of less than all of the memory cells.

It would be desirable for the invention to provide a circuit in a semiconductor memory which isolates a selected group of memory cells for clearing. It would further be desirable to provide a means of isolating the selected group of memory cells of each row from the remainder of the row in response to a bulk write signal. It would yet be desirable to bulk write to each memory cell in each column of the selected group of memory cells. Other objects and advantages will be apparent to those of ordinary skill in the art having reference to the following specification together with the drawings.

SUMMARY OF THE INVENTION

The invention may be incorporated into a memory circuit, a plurality of memory cells in an array arranged in rows and columns, each of the columns associated with a pair of bit lines. In each row, a selected group of memory cells is isolated from the remainder of the row in response to a bulk write signal. All of the memory cells in the selected group are then cleared by a bulk write operation by having a first logic state written into each cell.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Figure 1:
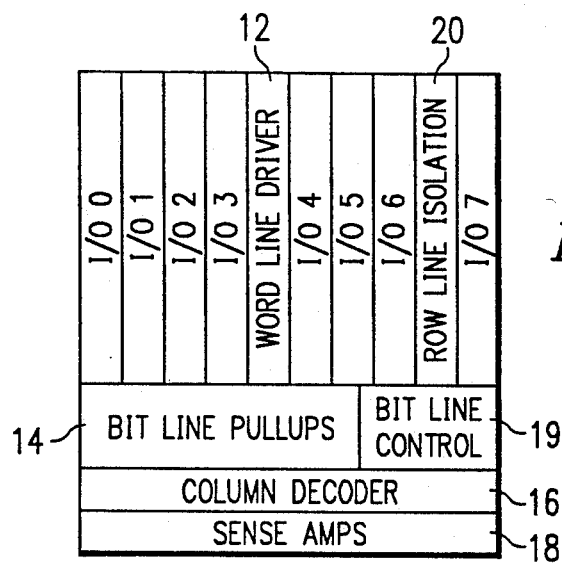
FIG. 1 illustrates an electrical diagram, in block form, of a memory of the present invention.

Referring now to FIG. 1, a block diagram is illustrated incorporating the preferred embodiment of the invention described herein which utilizes the bulk write scheme. The memory is comprised of a plurality of memory cells (not shown) arranged in rows and columns. Memory 10 is an integrated circuit memory, for example, a static random access memory (SRAM), having $2^{20}$, or 1,048,576, storage locations or bits. Memory 10, in this example, is organized as 128 k addressable locations of eight bits each. The physical organization of memory 10 is 1024 rows of 1024 columns, with eight columns accessed in each normal memory operation.

In this example of memory 10, the memory array is divided into eight sub-arrays. Each subarray contains multiple columns of memory cells. Each subarray or group of columns represents the same logical bit in the data field within the memory array and is generally referred to as an I/O. Memory 10 has eight subarrays identified as I/O 0 through I/O 7. A row of memory cells is selected by activating one of a plurality of word line drivers 12. The word line drivers select a row based upon an input that is operable to decode a row address. The memory cells in the row associated with the activated word line driver are then accessed and the contents thereof output onto bit lines. In this example, an SRAM architecture showing a central word line driver 12 feeding horizontally to memory arrays on either side of the driver 12 is shown. The I/O memory arrays for I/O 0 through I/O 3 are on the left side of the word line driver 12 and the I/O memory arrays for I/O 4 through I/O 7 are on the right side of the word line driver 12. The energizing of a row line through the word line drivers connects the contents of all memory cells in the row to their corresponding bit lines in a conventional manner.

Each of the bit lines in the memory 10 are connected to bit line pull-ups 14, or precharge transistor. In this example, the bit line pull-ups 14, which allow the bit lines to charge up quickly before any other operations occur, are located below the left and right I/O arrays 0 through 7. Each of the bit lines in the memory 10 are also connected to a column decode circuit 16. The column decode circuit 16 receives a portion of the location address and is located below the bit line pull-ups 14 in this example. The column decode circuit is operable to select one column of memory cells in each I/O array for data output. Sense amplifier circuits 18 are also located below the I/O arrays in this example and are provided for sensing and storing the data state on the bit lines in sub-arrays I/O 0 through I/O 7. The bit line control circuit 19 will control the bulk write operation to the memory cells in I/O array 7. The bit line control circuit is preferably located above or below the I/O array. It should be noted that many conventional arrangements and organizations in the memory architecture up to this point may be utilized in memory 10 according to the invention.

The memory 10 has a plurality of row isolation circuits 20 connected between two of the memory I/O arrays. In this example, the row isolation circuits 20 are located in each row and are connected between I/O array 6 and I/O array 7. The row isolation circuits will isolate the memory cells in each row in I/O array 7 from the remainder of the memory cells in the associated rows in memory 10.

Figure 2A:
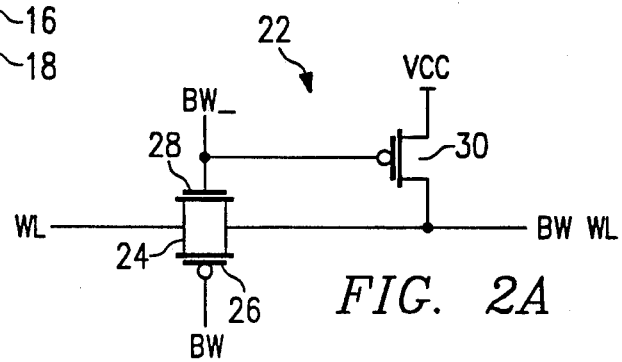
FIG. 2A–2B illustrate an electrical diagram, in schematic form of a row line isolation circuit of the present invention.

Referring to FIG. 2A, a schematic is shown which illustrates the row line isolation circuit. Each row in the row line isolation 20 in memory 10 will have a row line isolation circuit 22 located between two of the I/O memory arrays 6 and 7. Each isolation circuit 22 comprises a pass gate 24 which comprises a pair of pass transistors 26, 28. The pass gate 24 has a source-to-drain path between the selected group of memory cells in I/O array 7 and the memory cells in the remainder of the rows. In the preferred embodiment, one of the pair of pass transistors 26 comprises a p-channel transistor having a control terminal connected to a bulk write signal BW. The other transistor 28 of the pair comprises an n-channel transistor having a control terminal connected to the inverse of the bulk write signal BW_. Each of the pass transistors 26, 28 has a source-to-drain path between WL and BW WL, where BW WL represents the path to the selected memory cells in I/O array 7 and WL represents the signal received from the word line drivers 12.

Figure 2B:
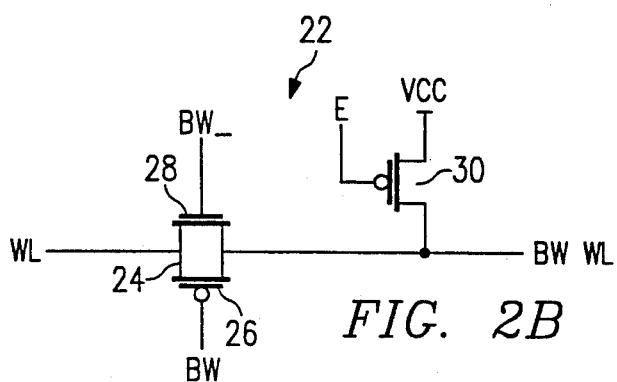

The isolation circuit 22 also comprises an enable transistor 30. In the preferred embodiment, enable transistor 30 comprises a p-channel transistor having a source-to-drain path between a first selected supply voltage $V_{cc}$ and BW WL which feeds into the selected group of memory cells in I/O array 7. Enable transistor 30 has a control terminal connected to BW_. In an alternative embodiment, the control terminal is connected to an enable signal E as shown in FIG. 2B.

Referring to FIG. 2A, a logical division for the bulk write operation depends upon the number of bits which need to be written, for any specific application. In this embodiment, the memory cells associated with one I/O, I/O array 7, are to be written to during the bulk write operation. During normal operation, the pass gate 24 conducts when the bulk write signal BW is low and BW_ is high, turning on both of the pass transistors 26, 28, thus coupling the WL and BW WL. In a bulk write operation, when the memory cells associated with I/O 7 are to be written to, the bulk write signal BW is brought high thus bringing the BW_ signal low. The pass gate 24 is turned off because both of the pass transistors 26, 28 are turned off. Turning off the pass gate 24 isolates the word line driver 12 from the memory cells in I/O array 7 for all rows. Enable transistor 30 is turned on when BW_ is brought low. When transistor 30 turns on, all rows in I/O array 7 are enabled by pulling BW WL to the selected supply voltage $V_{cc}$. All rows in I/O array 7 are enabled regardless of the state on WL. In this configuration, all memory cells in I/O array 7 in all rows are now isolated from the remainder of the memory cells in their associated rows.

In the preferred embodiment, the memory cells to be written to are located at one end of memory 10 for ease of isolation. In an alternative embodiment, if additional memory cells in memory 10 are to be written to, for example, all memory cells in both I/O arrays 6 and 7, the row line isolation circuits 22 would be located between I/O array 5 and I/O array 6, thus allowing the memory cells of I/O arrays 6 and 7 to be isolated from the memory cells in the remainder of the rows. Alternatively, less than all memory cells in an array may be written to, thus, the row line isolation circuit 22 would be located between the selected group of memory cells and the remainder of the memory cells in each row. Again, for ease of isolation, the selected group of memory cells to be written to are located at one or both ends of memory 10.

Figure 3:
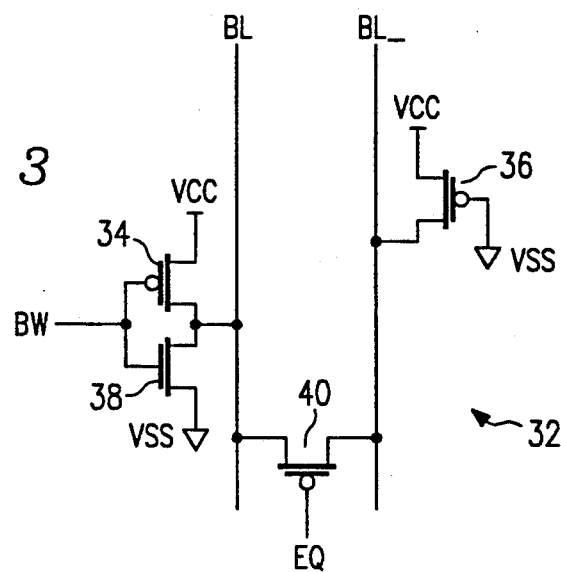
FIG. 3 illustrates an electrical diagram, in schematic form of a bit line control circuit of the present invention.

Referring to FIG. 3, a schematic is shown which illustrates the bit line control circuit of the present invention. As the selected memory cells in I/O array 7 are enabled by the enable transistor 30, each memory cell in I/O array 7 is written to, in response to the bulk write BW signal. The bulk write operation is accomplished by writing a first logic state into each memory cell in I/O array 7.

In the preferred embodiment, the bit line control circuit 32 comprises, for each column pair associated with the memory cells in I/O array 7, a first pull-up transistor 34 connected to a first bit line BL in a bit line pair and a second pull-up transistor 36 connected to a second bit line BL__ in the bit line pair. Alternatively, bit line control circuit 32 may control only a selected group of column pairs associated with the memory cells in I/O array 7. The bit line control circuit 32 further comprises means, connected to either BL or BL__, for driving the bit line to a selected value in response to the bulk write signal. Preferably, this means comprises a first transistor 38 which may be an n-channel pull-down transistor. The first pull-up transistor 34 has a source-to-drain path between a first selected supply voltage $V_{cc}$ and the bit line BL, and a control terminal connected to the bulk write signal BW. The second pull-up transistor 36 has a source-to-drain path between the first selected, supply, voltage $V_{cc}$ and the bit line BL__, and a control terminal connected to a second voltage which is sufficient to maintain the status of BL__, such as a supply voltage $V_{ss}$. The pull-down transistor 38 has a source-to-drain path between the bit line BL and the second selected voltage $V_{ss}$ and a control terminal connected to the bulk write signal BW.

The bit line control circuit 32 may also comprise a p-channel equilibration transistor 40 having a source-to-drain path connected between bit lines BL and BL__, and its gate connected to an equilibration signal EQ. During precharge, bit lines BL and BL__ are equilibrated to the same potential.

During a bulk write operation, all of the enabled memory cells in I/O array 7 may be written to by pulling down on one of the bit lines BL or BL__. In the above described configuration, during normal operation, the bulk write signal BW will be low causing the pull-up transistor 34 to be turned on and the pull-down transistor 38 to be turned off. This precharges the bit lines prior to sensing as known in the art. When the memory cells in I/O array 7 are to be written to, the bulk write signal BW goes high disabling the pull-up transistors 34 and enabling the pull-down transistor 38. The pull-down transistor 38 pulls down the bit line BL to the value of $V_{ss}$. All memory cells tied to the columns in I/O array 7 will be cleared or have a first logic state written to them in this manner. If there is an equilibration transistor 40, it will be inhibited during the bulk write operation so that equilibration of the bit lines BL and BL__ does not take place.

The peak current of the flash clear operation will increase during the bulk write operation, but not to the extent of the increase in current when all memory cells are written to or cleared at the same time in memory 10. By comparison to an arrangement wherein all columns of a memory array are necessarily simultaneously written to, the ability to selectively write to only those memory cells of a selected I/O array results in lower drive and power requirements and a lower associated noise level due to the lower drive current. The bulk write operation described herein, that is clearing a portion of a memory array, is faster than other approaches such as a staggered bulk write operation. There are other approaches to the above architecture for writing to or clearing the memory cells in I/O 7 such as through other logic which controls the write drivers or column selects associated with I/O 7. A need for other approaches will depend on such factors as simulation results and layout considerations.

While the invention has been described relative to its preferred embodiments, it should be understood that various modifications and alternatives to these embodiments will be apparent to those of ordinary skill in the art having reference to this specification and its drawings. It is contemplated that such modifications and alternatives are within the scope of this invention as subsequently claimed herein.

What is claimed is:

1. A memory in an integrated circuit, comprising:
   a plurality of memory cells in a memory array arranged in rows and columns, each of the memory cells capable of storing a logic state therein;
   a plurality of pairs of bit lines, each associated with one of the columns;
   a column decoder for selecting a plurality of columns in the array responsive to a column address;
   a plurality of word line drivers for selecting, in response to a row address, a row of memory cells wherein each memory cell is connected to its associated pair of bit lines;
   a plurality of row isolation circuits for isolating a selected group of memory cells in each row from the remainder of the row in response to a bulk write signal, each row isolation circuit having a conduction path between the selected memory cells in the associated row and the remainder of the row, wherein each row isolation circuit includes a pass gate having a conductive path and a control terminal for isolating the selected memory cells in each row from the remainder of the row in response to the bulk write signal, and an enable transistor for selecting, in response to a control signal, the selected group of memory cells; and
   means for receiving the bulk write signal in each column of the selected memory cells and writing a first logic state into the selected memory cells in response to the bulk write signal.

2. The memory of claim 1, wherein each row isolation circuit further comprises:
   a pair of pass transistors, each having a conductive path and a control terminal, wherein each of the pass transistors has a conductive path between the selected group of memory cells in the row and the remainder of the memory cells in the row, and wherein a first one of the pass transistors has its control terminal connected to the bulk write signal and a second one of the pass transistors has its control terminal connected to the inverse of the bulk write signal.

3. The memory of claim 2, wherein the enable transistor has a conductive path between a selected supply voltage and an output of the pass gate.

4. The memory of claim 2, wherein the pair of pass transistors comprise an n-channel transistor and a p-channel transistor.

5. The memory of claim 2, wherein the enable transistor comprises a p-channel transistor.

6. The memory of claim 1, wherein the control signal comprises the bulk write signal.

7. The memory of claim 1, wherein the control signal comprises an enable signal separate from the bulk write signal.

8. A memory in an integrated circuit, comprising:
   a plurality of memory cells in a memory array arranged in rows and columns, each of the memory cells capable of storing a logic state therein;
   a plurality of pairs of bit lines, each associated with one of the columns;
   a column decoder for selecting a plurality of columns in the array responsive to a column address;

a plurality of word line drivers for selecting, in response to a row address, a row of memory cells wherein each memory cell is connected to its associated pair of bit lines;

a plurality of row isolation circuits for isolating a selected group of memory cells of each row from the remainder of the row in response to a bulk write signal, each row isolation circuit having a conduction path between the selected memory cells in the associated row and the remainder of the row; and means for receiving the bulk write signal in each column of the selected memory cells and writing a first logic state into the selected memory cells in response to the bulk write signal, each including a first pull-up transistor connected to a first bit line of its associated bit line pair and a second pull-up transistor connected to a second bit line of its associated bit line pair, and means, connected to a bit line of the bit line pair, for driving the bit line to a selected value in response to the bulk write signal.

9. The memory of claim 8, wherein the means is a first transistor.

10. The memory of claim 9, wherein the first transistor is a pull-down transistor and wherein, in response to the bulk write signal, the first pull-up transistor is turned off, the first pull-down transistor is turned on, and the bit line is pulled low.

11. A memory in an integrated circuit, comprising:

a plurality of memory cells in a memory array arranged in rows and columns, each of the memory cells capable of storing a logic state therein;

a plurality of pairs of bit lines, each associated with one of the columns;

a column decoder for selecting a plurality of columns in the array responsive to a column address;

means for isolating a selected group of memory cells in each row from the remainder of the row in response to a bulk write signal, including a pass gate having a conductive path and a control terminal for isolating the selected memory cells in each row from the remainder of the row in response to the bulk write signal, and an enable transistor for selecting, in response to the bulk write signal, the selected group of memory cells; and means for receiving the bulk write signal in each column of the selected memory cells and writing a first logic state into the selected memory cells in response to the bulk write signal.

12. A memory in an integrated circuit, comprising:

a plurality of memory cells in a memory array arranged in rows and columns, each of the memory cells capable of storing a logic state therein;

a plurality of pairs of bit lines, each associated with one of the columns;

a column decoder for selecting a plurality of columns in the array responsive to a column address;

means for isolating a selected group of memory cells in each row from the remainder of the row in response to a bulk write signal, including a pair of pass transistors, each having a conductive path and a control terminal, wherein each of the pass transistors has a conductive path between the selected group of memory cells in the row and the remainder of the memory cells in the row, and wherein a first one of the pass transistors has its control terminal connected to the bulk write signal and a second one of the pass transistors has its control terminal connected to the inverse of the bulk write signal; and means for receiving the bulk write signal in each column of the selected memory cells and writing a first logic state into the selected memory cells in response to the bulk write signal.

13. A memory in an integrated circuit, comprising:

a plurality of memory cells in a memory array arranged in rows and columns, each of the memory cells capable of storing a logic state therein;

a plurality of pairs of bit lines, each associated with one of the columns;

a column decoder for selecting a plurality of columns in the array responsive to a column address;

means for isolating a selected group of memory cells in each row and the remainder of the row in response to a bulk write signal; and means for receiving the bulk write signal in each column of the selected memory cells and writing a first logic state into the selected memory cells in response to the bulk write signal, such means including a first pull-up transistor connected to a first bit line of its associated bit line pair and a second pull-up transistor connected to a second bit line of its associated bit line pair, and means, connected to a bit line of the bit line pair, for driving the bit line to a selected value in response to the bulk write signal.

14. The memory of claim 13, wherein the means is a first transistor.

15. The memory of claim 14, wherein the first transistor is a pull-down transistor and wherein the first pull-up transistor is turned off, the first pull-down transistor is turned on, and the bit line is pulled low in response to the bulk write signal.

* * * * *